United States Patent
Mughal et al.

(10) Patent No.: US 6,535,047 B2
(45) Date of Patent: Mar. 18, 2003

(54) APPARATUS AND METHOD TO USE A SINGLE REFERENCE COMPONENT IN A MASTER-SLAVE CONFIGURATION FOR MULTIPLE CIRCUIT COMPENSATION

(75) Inventors: Usman A. Mughal, Hillsboro, OR (US); Razi Uddin, Orangevale, CA (US); Chee How Lim, Hillsboro, OR (US); Songmin Kim, Beaverton, OR (US); Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/861,155

(22) Filed: May 17, 2001

(65) Prior Publication Data

US 2002/0171466 A1 Nov. 21, 2002

(51) Int. Cl.[7] .............................................. H03K 17/14
(52) U.S. Cl. ......................... 327/378; 327/170; 326/30; 326/86
(58) Field of Search ................................ 327/108, 112, 327/170, 378, 379, 389, 391; 326/30, 83, 86, 87; 323/316

(56) References Cited

U.S. PATENT DOCUMENTS

| | | | | |
|---|---|---|---|---|
| 4,719,369 A | * | 1/1988 | Asano et al. | 326/30 |
| 5,254,883 A | * | 10/1993 | Horowitz et al. | 326/30 |
| 5,666,078 A | * | 9/1997 | Lamphier et al. | 327/108 |
| 6,064,224 A | * | 5/2000 | Esch, Jr. et al. | 326/30 |
| 6,087,847 A | * | 7/2000 | Mooney et al. | 326/30 |
| 6,278,300 B1 | * | 8/2001 | Urakawa | 327/112 |
| 6,300,798 B1 | * | 10/2001 | Possley | 326/83 |
| 6,307,791 B1 | * | 10/2001 | Otsuka et al. | 326/30 |
| 6,316,957 B1 | * | 11/2001 | Aug et al. | 326/30 |

* cited by examiner

Primary Examiner—Terry D. Cunningham
Assistant Examiner—Long Nguyen
(74) Attorney, Agent, or Firm—Blakely, Sokoloff, Taylor & Zafman LLP

(57) ABSTRACT

A single external impedance element is used to perform multiple circuit compensation. A reference impedance code is first generated from a master circuit, and then the reference impedance code is provided (as a slave impedance code) to one or more slave circuits to activate devices in the slave circuit(s). Impedance-generation devices coupled to the slave circuit are then activated one at a time until their generated impedance corresponds to the impedance generated by the slave circuit. The reference impedance code can be incremented or decremented (e.g., shifted) to generate slave impedance codes corresponding to different impedance values, according to impedance requirements of various different circuits that require compensation. Using the single external impedance element for compensation of multiple circuits reduces motherboard and packaging costs.

26 Claims, 4 Drawing Sheets

APPARATUS AND METHOD TO USE A SINGLE REFERENCE COMPONENT IN A MASTER-SLAVE CONFIGURATION FOR MULTIPLE CIRCUIT COMPENSATION

TECHNICAL FIELD

This disclosure relates generally to electronic devices, and in particular but not exclusively, relates to use of a single reference component in a master-slave configuration to provide multiple circuit compensation.

BACKGROUND

Because high-frequency processors are becoming more sensitive to variations in process, supply voltage, and temperature (P-V-T), it becomes prudent to compensate critical circuits for these variations. For example, on-die termination circuits, input/output (I/O) pre-driver circuits, timing control circuits, etc. are compensated because they affect overshoots, undershoots, signal reflections, timing control (Tco), and signal edge rates. Comparing a resistance of an external resistor to the resistance of an internal compensation circuit is the basis for compensating these critical circuits. Accordingly, for each kind of circuit (e.g., on-die termination circuit, I/O pre-driver circuit, Tco circuit, etc.), a separate external resistor is used to compensate each of the required circuit attributes (such as impedance, slew rate, and timing).

FIG. 1 is a schematic diagram of a circuit compensation technique that uses multiple external resistors. The technique shown in FIG. 1 compensates a critical circuit across P-V-T by using an external resistor R (shown in FIG. 1 as having an example value of 100 Ohms) to match a resistance of a compensation circuit 10 formed on a chip 12. The compensation circuit 10 comprises a plurality of P-channel metal oxide semiconductor (PMOS) transistors, referred to as "transistor legs." In the example of FIG. 1, there are 32 transistor legs.

Matching the on-chip internal resistance of the compensation circuit 10 to the resistance of the external resistor R is done by having a first finite state machine FSM1 turn on the transistor legs one at a time until the effective on-chip internal resistance is approximately equal to the resistance of the external resistor R. At this moment, a comparator circuit 14 (coupled to the external resistor R, to the compensation circuit 10, and to a voltage supply Vdd) trips, and the number of activated transistor legs in the compensation circuit 10 is recorded by the finite state machine FSM1.

From this number of activated transistor legs, a digital impedance code is generated by the finite state machine FSM1 that represents the matched on-chip internal resistance. The finite state machine FSM1 then provides this impedance code (representing 100 Ohms in the example) to other compensation circuits, such as to other Tco circuits on the chip 12 if the compensation circuit 10 compensated for timing, so that these other compensation circuits can compensate that same circuit attribute.

However, if many different circuits need to be compensated across P-V-T for different circuit attributes, a separate impedance code needs to be generated for each circuit. Thus in FIG. 1, n circuits to be compensated require n external resistors Rx. As is often the case, the resistance of any one of the external resistors Rx (40 Ohms as an example in FIG. 1) needs to be different than the resistance of the external resistor R or the resistances of other external resistors.

As apparent in FIG. 1, compensation of many different circuits requires the use of multiple external resistors R to Rx. The use of multiple external resistors R to Rx increases packaging costs and motherboard costs, since multiple pads (e.g., pad 1 to pad n) or pins must be provided, respectively, for the external resistors R to Rx.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus and method to use a single reference component in a master-slave configuration to provide multiple circuit compensation are described herein. In the following description, numerous specific details are given, such as specific impedance values in FIGS. 2–4, to provide a thorough understanding of embodiments of the invention. One skilled in the relevant art will recognize, however, that the invention can be practiced without one or more of the specific details, or with other methods, components, materials, values, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the invention provides a more cost-effective technique for multiple circuit compensation by slaving one or more compensation circuits to a reference impedance code generated by a master compensation circuit. Multiple and different circuit attributes are compensated by being provided with slave impedance codes (which are derived from a single reference component) corresponding to their impedance requirements. In one embodiment, this single reference component is in the form of the single reference impedance code corresponding to an internal resistance that is substantially matched by the master compensation circuit to a resistance of a single external resistor.

Figure 1:
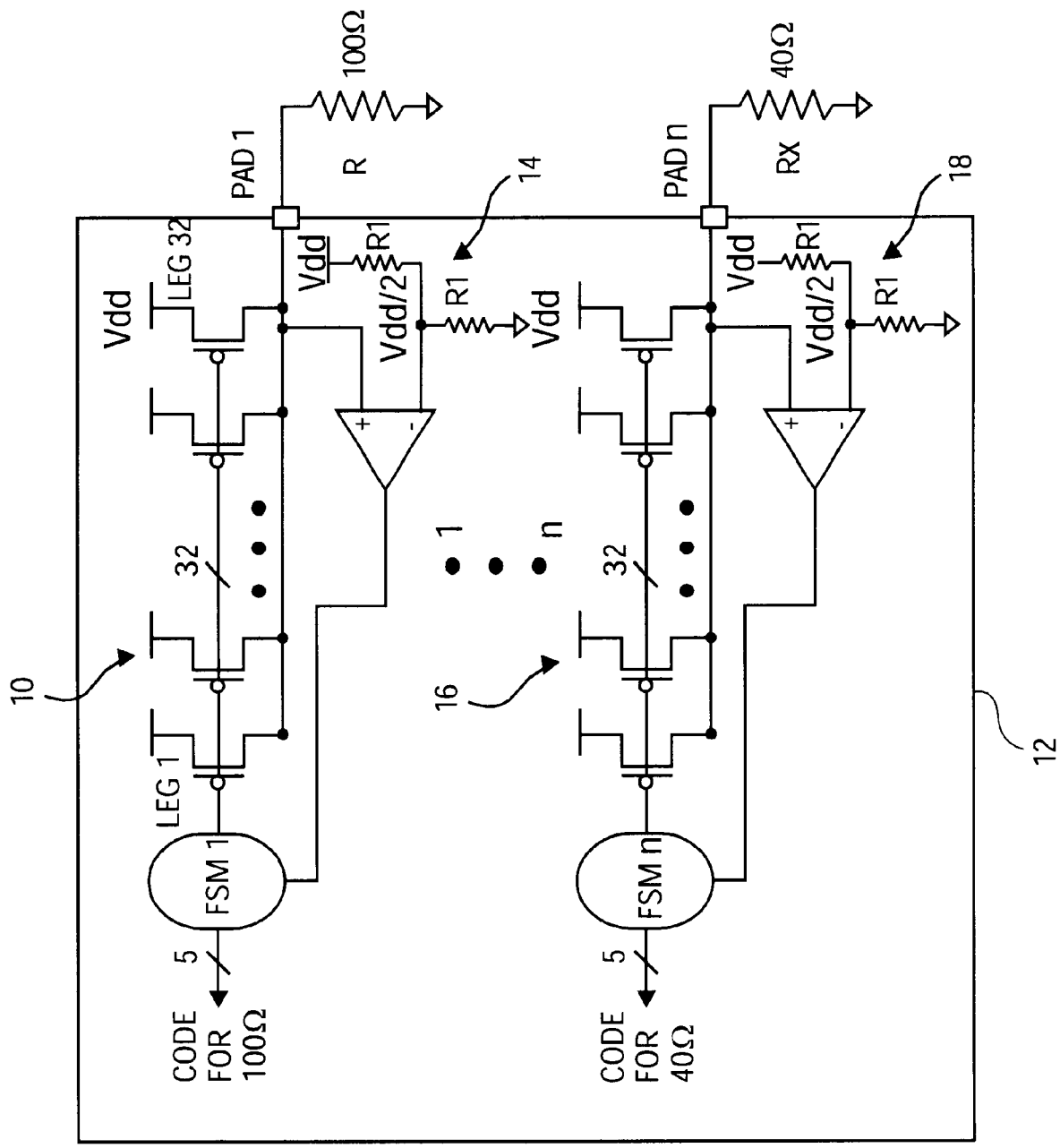
FIG. 1 is a schematic diagram of a circuit compensation technique that uses multiple external resistors.

Packaging costs are decreased since only one extra pin or pad need be used for compensation purposes, as compared to multiple pads for the compensation technique of FIG. 1. Motherboards cost are also decreased since only one external resistor need be used for compensation.

Figure 2:
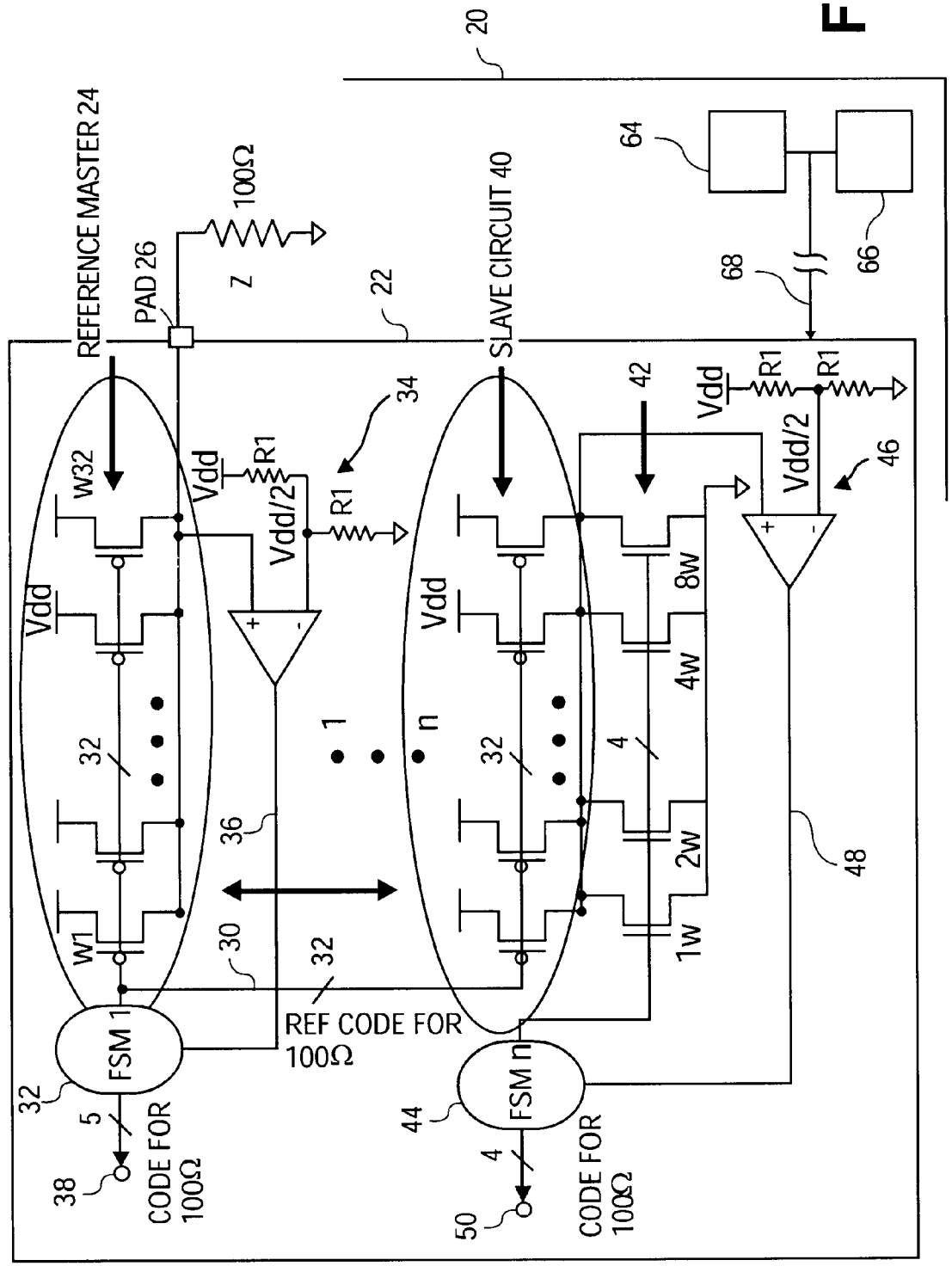
FIG. 2 is a schematic diagram of a circuit compensation technique in accordance with an embodiment of the invention.

FIG. 2 is a schematic diagram of a circuit compensation technique in accordance with an embodiment of the invention that uses a signal external resistor or other single external impedance element Z. The impedance element Z may be mounted on a motherboard 20. For purposes of illustration and explanation, the impedance element Z will be described herein as having a resistance of 100 Ohms. It is to be appreciated that this resistance value is merely an example and may be different in other embodiments. For the sake of discussion, the 100-Ohm resistance of the impedance element Z can be associated with an on-die termination circuit for a uni-processor system, although it may be associated with other different types of circuits, such as I/O pre-driver circuits, Tco circuits, on-die termination circuits for multi-processor systems, or other circuits.

A chip 22 is mounted on or otherwise coupled to the motherboard 20. At least one master compensation circuit 24 (e.g., a "reference master" or a "master circuit") is present on the chip 22. In an embodiment, the master compensation circuit 24 comprises a plurality of impedance-generation devices, shown in FIG. 2 as a plurality of PMOS transistors or transistor legs. For the sake of illustration, 32 transistor legs w1–w32 are shown in the embodiment of FIG. 2. It is to be appreciated that other compensation circuits on the chip 22 or other embodiments can have any number of transistor legs. Moreover, while the embodiment shown in FIG. 2 uses PMOS transistors in the master compensation circuit 24, other embodiments or other compensation circuits on the chip 22 can be implemented with N-channel metal oxide semiconductor (NMOS) transistors. In such NMOS implementations, a person skilled in the art having the benefit of this disclosure can re-configure the master compensation circuit 24 so that the NMOS transistors are connected as impedance-generation devices.

Source terminals of the transistor legs w1–w32 of the master compensation circuit 24 are coupled to a voltage source Vdd. Their drain terminals are coupled to the external impedance element Z by or at a pad 26. Their gate terminals are coupled by a bus 30 to a control circuit 32, which will be described later below. In the example of FIG. 2, there are 32 lines in the bus 30, corresponding to each of the transistor legs w1–w32.

The transistor legs w1–w32 can be associated to or correspond to a circuit attribute, such as on-die termination, I/O pre-driver strength, timing control slew rate, signal edge rate control, or other circuit attribute that can be compensated. For purposes of discussion herein, the transistor legs w1–w32 will be associated to compensation for the on-die termination circuit attribute for a uni-processor system.

A comparator circuit 34 is coupled to the impedance element Z and to the plurality of PMOS transistors in the master compensation circuit 24. An output terminal 36 of the comparator circuit 34 is coupled to the control circuit 32, which in one embodiment includes a first finite state machine FSM1. An embodiment of the control circuit 32 also includes an up/down counter (not shown). The counter is coupled to the output terminal 36 of the comparator circuit 34, and is also coupled to the gate terminals of the PMOS transistors in the master compensation circuit 24 via the bus 30.

In operation, the control circuit 32 first generates a reference impedance code. This is done by having the control circuit 32 activate the transistor legs w1–w32 in the master compensation circuit 24 one at a time until the impedance (or conductance) of the activated transistor legs substantially matches the resistance/impedance of the external impedance element Z, which in this example is 100 Ohms. Once there is a substantial match of impedances, the comparator circuit 34 trips and provides a signal at its output terminal 36 to the control circuit 32. The signal from the comparator circuit 34 causes the control circuit 32 to read the value in the counter, which in this case has recorded the number of transistor legs that are activated to match 100 Ohms. In an embodiment, the number provided by the counter is a digital or binary number that the first finite state machine FSM1 (or other component of the control circuit 32) designates or otherwise produces as the reference impedance code that corresponds to the impedance of the activated transistor legs.

The generated reference impedance code is then provided to other compensation circuits 38 by the control circuit 32 to compensate the same circuit attribute. For instance, if the master compensation circuit 24 compensated for on-die termination (Rtt) for an I/O circuit and generated a reference impedance code "10" that corresponds to the transistor legs w1–w10 that were activated to substantially match the 100-Ohm resistance of the external impedance element Z, then the control circuit 32 provides the "10" reference impedance code (via five output lines, as shown as an example in FIG. 2) to other compensation circuits 38 that also compensate on-die termination Rtt for other I/O circuits on the chip 22. These other Rtt compensation circuits, in turn, activate 10 of their transistor legs to obtain a 100-Ohm matching internal resistance/impedance.

In accordance with an embodiment of the invention, one or more slave circuits 40 is coupled to the control circuit 32. The slave circuit 40 receives a slave impedance code from the control circuit 32 that is based on or derived from the reference impedance code. Thus in the illustrated example, the slave circuit 40 receives a slave impedance code corresponding to 100 Ohms from the control circuit 32 via the bus 30.

In an embodiment, there may be n−1 slave circuits 40 that are used to compensate n−1 different circuit attributes. According to an embodiment as well, each slave circuit 40 may be identical (e.g., a copy of) the master compensation circuit 24, such that the devices the slave circuit 40 comprises PMOS transistors. Therefore, in the example of FIG. 2, the slave circuit 40 comprises 32 transistor legs (which are similar in type and number to those in the master compensation circuit 24).

A plurality of impedance-generation devices 42 is coupled to the slave circuit 40. In an embodiment, the impedance-generation devices 42 comprise binary-weighted NMOS transistors. The impedance-generation devices 42 are capable of activation based on a number of activated devices in the slave circuit 40, and have gate terminals that are coupled to another control circuit 44, which may include another finite state machine FSMn. The impedance-generation devices 42 are responsive to the control circuit 44 to activate/deactivate. A comparator circuit 46 is coupled to the impedance-generation devices 42, and has an output terminal 48 coupled to the control circuit 44 to provide the control circuit 44 with a signal indicative of whether the impedance provided by the activated devices of the plurality of impedance-generation devices 42 is sufficient to compensate the circuit attribute.

For the embodiment shown in FIG. 2, the slave circuit 40 may be used to compensate a circuit attribute that is different from the circuit attribute compensated by the master compensation circuit 24. Thus as an example, if the master compensation circuit 24 compensated for on-die termination Rtt at 100 Ohms, the slave circuit 40 can be used to compensate for slew rate at 100 Ohms. Operation of the embodiment of FIG. 2 to compensate a different circuit attribute at the same impedance is described as follows.

First, the slave circuit 40 receives the slave impedance code from the control circuit 32. Since both the master compensation circuit 24 and the slave circuit 40 are copies of each other and will be compensating to the same impedance value, the slave impedance code received by the slave circuit 40 is identical to the reference impedance code provided by the control circuit 24. The PMOS transistors in the slave circuit 40 are capable of activation or deactivation based on this received impedance code, and therefore, the same number of devices in the master compensation circuit 24 and in the slave circuit 40 will be activated.

Second, based on the received slave impedance code, the same number of PMOS transistors in the slave circuit 40 are activated, thus providing approximately 100 Ohms of impedance in the example. Next, the control circuit 44 turns on the impedance-generation devices 42 one at a time until their total generated impedance is close to the total impedance of the slave circuit 40.

When there is a substantial match in impedance (e.g., approximately 100 Ohms in the example), the comparator circuit 46 trips, and sends the signal via the output terminal 48 to the control circuit 44 to indicate that impedance compensation is sufficient or has been otherwise achieved. The control circuit 44 then generates an impedance code that corresponds to the number of activated impedance-generation devices 42, and sends this impedance code to other compensation circuits 50 that compensate the same circuit attribute (e.g., other slew rate compensation circuits requiring 100 Ohms).

Thus, it is evident that the slave circuits 40 behave somewhat analogously as external resistors for other circuits requiring compensation. Moreover, use of the slave circuits 40 in this manner reduces the number of external impedance elements Z that are required for circuit compensation. Thus, an embodiment of the invention need utilize only the single external impedance element Z for multiple circuit compensation. It is to be appreciated, however, that in other embodiments where motherboard costs and packaging costs are less of a concern, additional external impedance elements Z may be used for multiple circuit compensation.

It is noted that use of the PMOS transistors in the slave circuit 40 in the manner described above allows use of NMOS transistors as the impedance-generation devices 40 for compensation. That is, an embodiment of the invention allows NMOS transistors to be used for circuits that may be better suited for compensation by N-channel devices, with activation of the NMOS transistors being based on activation of PMOS transistors.

It is further noted that NMOS transistors in the plurality of impedance-generation devices 42 are binary-weighted in an embodiment, such that progressive activation of each NMOS transistor results in binary increases in impedances. It is to be appreciated that other embodiments may use NMOS transistors that are not binary-weighted. It is also to be appreciated that the (PMOS master)-to-(PMOS slave)-to-(NMOS impedance-generation devices 42 for compensation) can be configured differently in other embodiments. An example is (NMOS master)-to-(NMOS slave)-to-(PMOS impedance-generation devices 42 for compensation). It is to be further appreciated that, in other embodiments, suitable combinations of PMOS and NMOS transistors can be used within any one of the master compensation circuit 24, the slave circuit(s) 40, and the plurality of impedance-generation devices 42.

Figure 3:
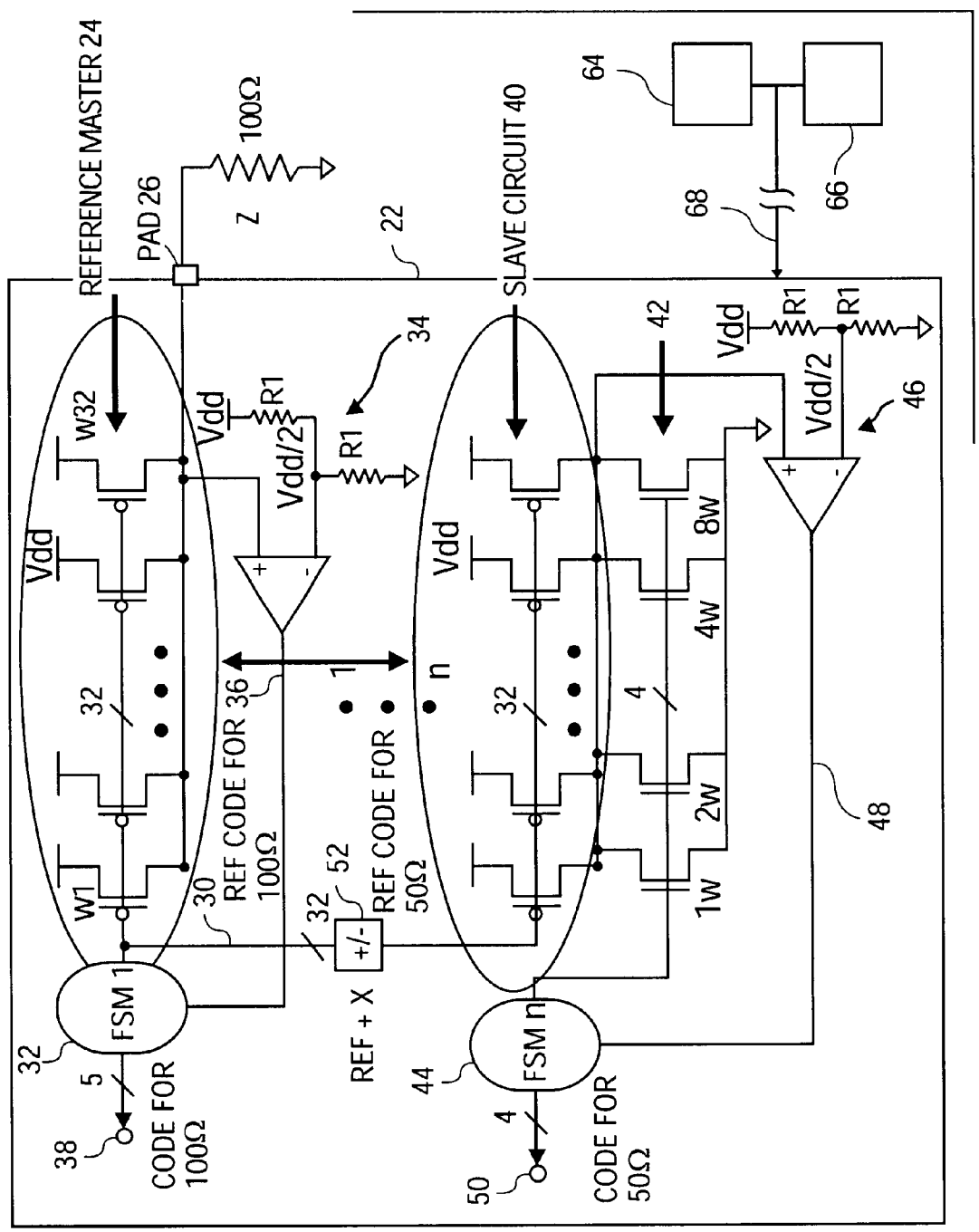
FIG. 3 is a schematic diagram of a circuit compensation technique in accordance with another embodiment of the invention.

The embodiment illustrated in FIG. 2 uses the slave circuit 40 to compensate a different circuit attribute to the same impedance (e.g., to 100 Ohms) as that compensated by the master compensation circuit 24. FIG. 3 is a schematic diagram of a circuit compensation technique that can be used to compensate to a different impedance than that compensated by the master compensation circuit 24.

In the embodiment of FIG. 3, the reference impedance code generated by the control circuit 32 is shifted up or shifted down to obtain the slave impedance code that is ultimately provided to the slave circuit 40. This impedance code shifting is shown generally at 52, where as an example, the reference impedance code for 100 Ohms is shifted to obtain a slave impedance code for 50 Ohms that is provided to the slave circuit 40.

The code shifting at 52 of FIG. 3 can be used alternatively or in addition to the embodiment of FIG. 2. For instance, a single master compensation circuit 24 on the chip 22 can be used in conjunction with the control circuit 32 to perform no impedance code shifting for other circuits on the chip 22 requiring compensation at the same impedance, or impedance code shifting may be performed for other circuits on the chip 22 that do require compensation at a different impedance. As an example for a single chip 22, the master compensation circuit 24 can be used to compensate for on-die termination Rtt at 100 Ohms, while one of the slave circuits 40 of FIG. 3 can be used to compensate timing control at 50 Ohms and another one of the slave circuits 40 can be used to compensate slew rate at 100 Ohms.

Impedance code shifting operates according to one embodiment as follows. First, once the reference impedance code is generated by the control circuit 32, the first finite state machine FSM1 shifts the reference impedance code up or down to generate slave impedance codes to compensate for other different circuit attributes. Examples of amounts of these shifts to compensate other circuit attributes for illustrative purposes (for a different situation where the reference impedance code corresponds to 51 Ohms, rather than the 100 Ohms of FIG. 3) include, but are not limited to, an upward shift of 18 to compensate on-die termination for a dual-processor system to 8 Ohms, a downward shift of −4 to compensate edge rate control to 78 Ohms, a downward shift of −12 to compensate for I/O timing control (Tco) to 180 Ohms, and so on. These example values and shifting amounts are shown in a table 54 of FIG. 4, which will be explained later below.

This shifting denoted at 52 in FIG. 3 results in generation of new impedance codes that are derived from the reference impedance code and which comprise the slave impedance code(s) provided to the slave circuit 40. In accordance with an embodiment of the invention, the counter (not shown) in the control circuit 32 can at least partly control activation or deactivation of individual devices in the slave circuit 40 based on the amount of the shift of the reference impedance code. Therefore, for example, if the slave impedance code for 8 Ohms is to be provided to the slave circuit 40, then the counter counts up (e.g., shifts or increments) the value of the reference impedance code by 18 (see, e.g., FIG. 4). This new impedance code is provided by the control circuit 32, via the bus 30, to gate terminals of the PMOS transistors in the slave circuit 40. In response, at least one PMOS transistor of the slave circuit 40 is activated to provide compensation impedance that corresponds to the received slave impedance code.

In an embodiment of the invention, the PMOS transistors in the master compensation circuit 24 (as well as in the slave circuits 40 on the chip 22) have variable physical widths. These variable widths provide the PMOS transistors with different individual impedances when they are activated. Hence, by designing the total number of PMOS transistors present in each master compensation circuit 32 (or slave circuits 40) and by selecting the widths of the individual transistors, a range of impedances can be made available and the change in impedance for each shift can be calculated/designed.

The width of each transistor leg in one embodiment can be calculated as $W_n = W_{n-1} + y^*W_{n-1}$, where y is the incremental width from one transistor leg to the next transistor leg and where n=1 for the starting width for the first transistor leg. For the specific embodiment shown in FIG. 3 for the PMOS transistors in the master compensation circuit 24 or for the slave circuits 40, n is between [2,32] since 32 PMOS transistors are present in each circuit.

$W_n$ is the total width of the n transistor legs turned on. The resistance/impedance is generally inversely proportional to $W_n$, such that as the number of transistor legs that are turned on increase, the total impedance decreases. The total impedance or resistance can be generally stated as $R_n \approx K/W_n$, where $K=L/(U_n C_{ox} V_{eff})$. In this equation, L is the length, $U_n$ is the mobility, $C_{ox}$ is the gate oxide capacitance, and $V_{eff}$ is the gate-to-source voltage $V_{GS}$ minus the threshold voltage $V_t$ for the transistor legs.

The incremental width y (e.g., "step") from one transistor to another can be 10% (e.g., y=0.1), and it is to be appreciated that y can be a greater or lesser percentage based on the desired amount of precision. For instance, if y is a smaller percentage (including no change in width for PMOS transistors of uniform widths) then shifting from one set of turned-on PMOS transistor legs to another set of PMOS transistor legs results in a smaller change in impedance, and hence more precise impedance adjustment. In such a case, more PMOS transistors may be formed on the chip 22 if a greater range for the total impedance is desired. Conversely, if y is made larger, shifting from one set of turned-on PMOS transistor legs to another set of PMOS transistor legs results in greater impedance changes.

Thus, the PMOS transistors in one embodiment have different widths that correspond to a different impedance that can be generated by each PMOS transistor. A shift in the reference impedance code by the control circuit 32 at 52 results in activation or deactivation of PMOS transistors in any one of the slave circuits 40 to generate different impedances based on an amount of the shift, with these impedances being ultimately used as the basis for impedance compensation provided by the impedance-generation devices 42.

Figure 4:
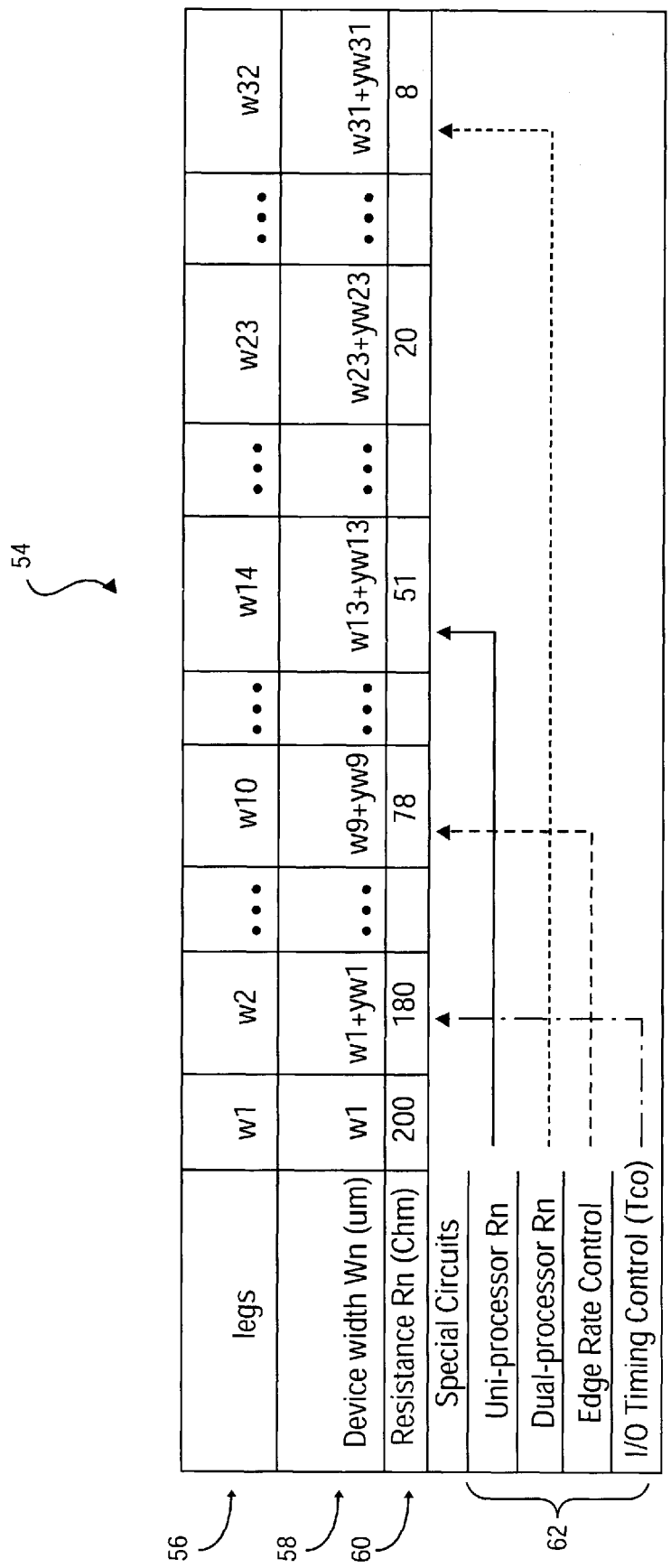
FIG. 4 is a table illustrating impedance code shifting that can be used for the compensation technique of FIG. 3.

FIG. 4 is a table 54 that illustrates an embodiment of impedance code shifting that can be used for the compensation technique of FIG. 3, where the reference impedance code is 51 Ohms as an illustrative example. Specifically, the table 54 has entries for the total resistance $R_n$, the transistor legs w1–w32, the amount of shifting for the reference impedance code, and the circuit types (or circuit attributes) to be compensated, and so on. For the table of FIG. 4, y has a value of 0.1 for purposes of discussion, meaning that the PMOS transistors in the master compensation circuit 24 (and in the slave circuit 40) have a step increase in width of 10% relative to a width of a previous adjacent PMOS transistor. Hence, the resistance $R_n$ decreases by 10% as the PMOS transistors are activated one at a time. It is understood that the entries in the table 54 are merely for explanation and are not necessarily intended to fully reflect actual circuit conditions.

The table 54 identifies the transistor legs w1–w32 at 56. The width(s) $W_n$ of the activated PMOS transistors are indicated at 58, which may have values in microns. The total resistance $R_n$ for the activated transistors is indicated at 60. Hence, the resistance of the first activated PMOS transistor can be 200 Ohms. The resistance of the first and second activated PMOS transistors is thus 200 Ohms minus (0.1) (200 Ohms)=180 Ohms. The remaining values of the total resistance $R_n$ up to the transistor leg w32 can be roughly calculated for the table 54 using this methodology. Examples of various different circuits (or different circuit attributes) to be compensated are shown at 62.

The reference impedance code corresponding to 51 Ohms is shown in the table 54 as corresponding to 14 activated PMOS transistors (e.g., the transistor legs w1 to w14) for compensation of on-die termination (Rtt) for a uni-processor system. If it is known (from design simulation or via other testing technique) that compensation for on-die termination Rtt for a dual-processor system will require 8 Ohms and hence 32 activated transistor legs, the reference impedance code corresponding to 51 Ohms (14 activated transistor legs) is shifted upward (e.g., to the right in the table 54 by adding 18 to the reference impedance code) to generate a new impedance code to activate the transistor legs w1 to w32.

For downward shifting to obtain a higher resistance, such as to compensate for edge rate control at 78 Ohms, the reference impedance code is shifted to the left (e.g., the reference impedance code is subtracted by 4) so that a new impedance code to activate the transistor legs w1 to w10 is generated. For obtaining an even greater compensation resistance, such as for I/O timing control at 180 Ohms, the reference impedance code is shifted to the left (e.g., the reference impedance code is subtracted by 12) such that an impedance code to activate the transistor legs w1 and w2 is generated. Thus, via reference code shifting, the required compensation impedance codes for other circuits are obtained.

In an embodiment, multiple circuit compensation may be performed on a regular basis, so that circuit compensation can be continuously updated. This updating can involve monitoring circuit conditions, and then repeating the generation of and/or shifting of the reference impedance code, and repeating the using of the reference impedance code to activate or deactivate at least one or more PMOS transistor legs in a particular slave circuit 40. This repeating can thus be performed in response to a change in state of a circuit attribute, such as a change due to P-V-T for impedance, slew rate, timing control, and the like, to deactivate or activate impedance-generation devices in any of the compensation circuits identified above.

Referring again to FIGS. 2 and 3, the control circuit 32 (and/or other components on the chip 22) may be controlled by instructions (such as software or other machine readable code) to perform the various shifting, PMOS transistor activation/deactivation, or other operations described above, in response to a state of a particular circuit attribute. Such instructions may be stored on a machine-readable medium 64 coupled to or mounted on the motherboard 20 (or on the chip 22). In one embodiment, these instructions can be executed by a processor 66. Both the processor 66 and the machine-readable medium 64 can be connected to each other and to components on the chip 22 via a bus 68. In an embodiment, the multiple circuit compensation described above can be performed as part of a basic input/output system (BIOS) routine during startup, or may be performed at other times by other routines.

In conclusion, an embodiment of the invention uses the single external impedance element Z to perform multiple circuit compensation. A reference impedance code is first generated from the master compensation circuit 24, and then the reference impedance code is provided (as a slave impedance code) to one or more slave circuits 40 to activate devices in the slave circuit(s). The impedance-generation devices 42 coupled to the slave circuit 40 are then activated one at a time until their generated impedance corresponds to the impedance generated by the slave circuit 40. The reference impedance code can be incremented or decremented (e.g., shifted) to generate slave impedance codes corresponding to different impedance values, according to impedance requirements of various different circuits that require compensation. Using the single external impedance element for compensation of multiple circuits reduces motherboard and packaging costs.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a single external impedance element having an impedance;
   a master circuit coupled to the single external impedance element and having impedance-generation devices to provide an impedance that substantially matches the impedance of the external impedance element to compensate an attribute of a circuit;
   a control circuit coupled to the master circuit to generate a reference impedance code based on a number of activated devices in the master circuit;
   a slave circuit coupled to the control circuit to receive a slave impedance code from the control circuit that is based on the reference impedance code and having devices that are capable of activation based on the received slave impedance code; and
   another plurality of impedance-generation devices coupled to the slave circuit and capable of activation, based on a number of activated devices in the slave circuit, to provide another impedance different from the impedance of the master circuit to compensate a different attribute of the circuit.

2. The apparatus of claim 1 wherein the slave circuit is identical to the master circuit.

3. The apparatus of claim 1 wherein the devices of the master circuit and of the slave circuit comprise P-channel transistors.

4. The apparatus of claim 3 wherein the another plurality of impedance-generation devices coupled to the slave circuit comprises N-channel transistors.

5. The apparatus of claim 1, further comprising another control circuit coupled to the another plurality of impedance-generation devices coupled to the slave circuit, wherein the another plurality of impedance-generation devices is responsive to the another control circuit to activate or deactivate based on the number of activated devices in the slave circuit.

6. The apparatus of claim 5, further comprising a comparator circuit coupled to the another plurality of impedance-generation devices coupled to the slave circuit, the comparator circuit having an output terminal coupled to the another control circuit to provide the another control circuit with a signal indicative of whether the another impedance provided by the activated devices in the another plurality of devices is sufficient to compensate the different attribute.

7. The apparatus of claim 1 wherein the control circuit is capable to shift the reference impedance code to generate the slave impedance code and to provide the slave impedance code to the slave circuit, and wherein the slave impedance code generated from the shifted reference impedance code corresponds to a different value for the another impedance provided by the another plurality of impedance-generation devices as compared to a value of the impedance provided by the master circuit.

8. The apparatus of claim 7 wherein slave circuit comprises a plurality of transistors having different widths that correspond to a different impedance generated by each transistor, and wherein a shift in the reference impedance code by the control circuit to generate the slave impedance code results in activation or deactivation of the transistors in the slave circuit to cause generation of different impedances by the another plurality of impedance-generation devices that are related to an amount of the shift.

9. The apparatus of claim 1 wherein the single external impedance element comprises a resistor.

10. The apparatus of claim 1 wherein the attributes include on-die termination, input/output pre-driver strength, timing control, slew rate, or edge rate control.

11. An apparatus, comprising:
    a single external impedance element having an impedance;
    a first plurality of impedance-generation devices coupled to the single external impedance element as a master circuit and associated with an attribute of a circuit;
    a first control circuit coupled to the master circuit, the first control circuit to produce a reference impedance code corresponding to an impedance substantially matched to the impedance of the single external impedance element based on a number of activated devices in the first plurality of impedance-generation devices;
    a slave circuit coupled to the first control circuit to receive the reference impedance code from the first control circuit and having devices to be activated based on the received reference impedance code;
    a second plurality of impedance-generation devices coupled to the slave circuit; and
    a second control circuit coupled to the second plurality of impedance-generation devices, wherein at least one device of the second plurality of impedance-generation devices is responsive to the second control circuit to activate or deactivate based on a number of activated devices in the slave circuit to generate another impedance associated with another attribute of the circuit devices different from the attribute of the circuit devices, wherein the another impedance is different from the impedance.

12. The apparatus of claim 11 wherein the devices of the master circuit and of the slave circuit comprise P-channel transistors and wherein the second plurality of impedance-generation devices comprise N-channel transistors.

13. The apparatus of claim 11 wherein the first control circuit is capable to shift the reference impedance code to generate the slave impedance code and to provide the slave impedance code to the slave circuit, and wherein the slave impedance code generated from the shifted reference impedance code corresponds to a different value for the impedance generated by the second plurality of impedance-generation devices as compared to a value of the impedance that is substantially matched to the impedance of the single external impedance element.

14. The apparatus of claim 13 wherein slave circuit comprises a plurality of transistors having different widths that correspond to a different impedance generated by each transistor, and wherein a shift in the reference impedance code by the first control circuit to generate the slave impedance code results in activation or deactivation of the transistors in the slave circuit to cause generation of different impedances by the second plurality of impedance-generation devices that are related to an amount of the shift.

15. A system, comprising:
a single external impedance element having an impedance and mounted on a motherboard;
a master circuit on a chip and having impedance-generation devices to provide an impedance that substantially matches the impedance of the external impedance element to compensate an attribute of a circuit, the master circuit being coupled to the single external impedance element by a pad or pin;
a control circuit on the chip and coupled to the master circuit to generate a reference impedance code based on a number of activated devices in the master circuit;
a slave circuit on the chip and coupled to the control circuit to receive a slave impedance code from the control circuit that is based on the reference impedance code and having devices to be activated based on the received slave impedance code; and
another plurality of impedance-generation devices on the chip and coupled to the slave circuit, based on a number of activated devices in the slave circuit, to provide another impedance different from the impedance of the master circuit to compensate a different attribute of the circuit.

16. The system of claim 15, further comprising a bus that couples the chip to a processor mounted on the motherboard via another pad or pin, wherein the attribute of the circuit that is compensated by the master circuit is related to an impedance of the bus.

17. The system of claim 15 wherein the control circuit is capable to shift the reference impedance code to generate the slave impedance code and to provide the slave impedance code to the slave circuit, and wherein the slave impedance code generated from the shifted reference impedance code corresponds to a different value for the another impedance provided by the another plurality of impedance-generation devices as compared to a value of the impedance provided by the master circuit.

18. The system of claim 17, further comprising a machine-readable medium having instructions stored thereon to control operation of the control circuit to activate or deactivate at least one device in the slave circuit based on the shift of the reference resistance code, in response to a state of the different attribute of the circuit.

19. A method, comprising:
in a master circuit, activating at least one of a first plurality of impedance-generation devices associated to a first attribute of a circuit, until an impedance of the activated impedance-generation devices substantially matches an impedance of a single external impedance element;
based on a number of activated devices in the first plurality of impedance-generation devices, generating a reference impedance code corresponding to the impedance of the activated impedance-generation devices;
providing a slave impedance code that is based on the reference impedance code to a slave circuit;
using the slave reference impedance code to activate at least one device in the slave circuit; and
based on a number of activated devices in the slave circuit, activating at least one of a second plurality of impedance-generation devices to generate another impedance associated with a second attribute of the circuit that is different from the first attribute associated with the first impedance-generation devices, wherein the another impedance is different from the impedance.

20. The method of claim 19, further comprising shifting the reference impedance code to obtain the slave impedance code, wherein the slave impedance code obtained from the shifted reference impedance code corresponds to an impedance value different from an impedance value associated with the reference impedance code.

21. The method of claim 20 wherein the second plurality of impedance-generation devices comprises transistors having different widths that correspond to a different resistance generated by each transistor, and wherein shifting the reference impedance code to obtain the slave impedance code results in generation of different resistances by the transistors that are based an amount of the shift.

22. The method of claim 20, further comprising repeating the shifting of the reference impedance code to generate a new impedance, in response to a change in state of the second attribute.

23. An article of manufacture, comprising:
a machine-readable medium having instructions stored thereon to:
for a master circuit, activate at least one of a first plurality of impedance-generation devices associated to a first attribute of a circuit, until an impedance of the activated impedance-generation devices substantially matches an impedance of a single external impedance element;
based on a number of activated devices in the first plurality of impedance-generation devices, generate a reference impedance code corresponding to the impedance of the activated impedance-generation devices;
provide a slave impedance code that is based on the reference impedance code to a slave circuit;
use the slave reference impedance code to activate at least one device in the slave circuit; and
based on a number of activated devices in the slave circuit, activate at least one of a second plurality of impedance-generation devices to generate another impedance associated with a second attribute of the circuit that is different from the first attribute associated with the first impedance-generation devices, wherein the another impedance is different from the impedance.

24. The article of manufacture of claim 23 wherein the instructions to provide the slave impedance code that is based on the reference impedance code include instructions to shift the reference impedance code to obtain the slave impedance code.

25. The article of manufacture of claim 24 wherein the machine-readable medium further includes instructions stored thereon to repeat the shifting of the reference impedance code to generate new slave impedance codes, in response to a change in state of the second attribute.

26. The article of manufacture of claim 23 wherein the instructions stored on the machine-readable medium are executable by a processor as part of a basic input/output system (BIOS) routine.

* * * * *